(12) United States Patent
Chemisky et al.

(10) Patent No.: US 7,525,783 B2
(45) Date of Patent: Apr. 28, 2009

(54) MONITORING METHOD FOR AN ACTUATOR AND CORRESPONDING DRIVER CIRCUIT

(75) Inventors: Eric Chemisky, Lauterbourg (DE); Walter Schrod, Regensburg (DE)

(73) Assignee: Siemens Aktiengesellschaft, Munich (DE)

(*) Notice: Subject to any disclaimer, the term of this patent is extended or adjusted under 35 U.S.C. 154(b) by 141 days.

(21) Appl. No.: 10/537,624

(22) PCT Filed: Oct. 31, 2003

(86) PCT No.: PCT/DE03/03635

§ 371 (c)(1),
(2), (4) Date: Jun. 3, 2005

(87) PCT Pub. No.: WO2004/051066

PCT Pub. Date: Jun. 17, 2004

(65) Prior Publication Data

US 2006/0067024 A1  Mar. 30, 2006

(30) Foreign Application Priority Data

Dec. 3, 2002  (DE) ............................... 102 56 456

(51) Int. Cl.
*H01H 47/00* (2006.01)

(52) U.S. Cl. .................................................... 361/139

(58) Field of Classification Search .................. 361/139
See application file for complete search history.

(56) References Cited

U.S. PATENT DOCUMENTS

| 4,736,267 A | 4/1988 | Karlmann et al. ............ 361/101 |
| 5,173,832 A * | 12/1992 | Giorgetta et al. .............. 361/88 |
| 6,232,781 B1 | 5/2001 | Göser et al. .................. 324/422 |

(Continued)

FOREIGN PATENT DOCUMENTS

DE  689 02 028 T2  3/1990

(Continued)

OTHER PUBLICATIONS

Rudolph, G.: "Intelligenter Doppeltreiber für inductive Lasten" [Smart Double Driver for Inductive Load], Elektronik, Franzis Verlag GmbH München, vol. 42, No. 7, Apr. 6, 1993, pp. 86, 91-93.

*Primary Examiner*—Michael J Sherry
*Assistant Examiner*—Luis Roman
(74) *Attorney, Agent, or Firm*—Laurence A. Greenberg; Werner H. Stemer; Ralph E. Locher (57) ABSTRACT

The invention relates to a monitoring method for an actuator (CP), in particular for a piezoelectric actuator (CP) on an injection valve for an internal combustion engine, comprising the following steps: measurement of the electrical current (iR1), flowing through the actuator (CP) in an actuator circuit, measurement of the electrical current (iR3), flowing before or after the actuator (CP) in the actuator circuit, comparison of both measured currents (iR1, iR2) for recognition of a fault and generation of a diagnostic signal (DIAG), displaying the fault, depending on the comparison. According to the invention, the diagnostic signal (DIAG) can take on at least three different values for the representation of an earth short-circuit, a voltage short-circuit and an error-free status depending on the comparison of the measured currents. The invention further relates to a corresponding driver circuit.

7 Claims, 11 Drawing Sheets

U.S. PATENT DOCUMENTS

| | | | |
|---|---|---|---|
| 6,497,222 B2 | 12/2002 | Bolz et al. | 123/479 |
| 6,498,418 B2 * | 12/2002 | Rueger | 310/316.03 |
| 6,619,268 B2 * | 9/2003 | Rueger et al. | 123/490 |
| 6,700,301 B2 | 3/2004 | Rueger et al. | 310/316.03 |
| 6,820,474 B2 | 11/2004 | Rueger et al. | 73/119 A |
| 2002/0041475 A1 | 4/2002 | Rueger et al. | 310/316.03 |
| 2002/0162539 A1 | 11/2002 | Bolz et al. | 123/479 |
| 2004/0008032 A1 | 1/2004 | Rueger et al. | 73/119 A |

FOREIGN PATENT DOCUMENTS

| | | |
|---|---|---|
| DE | 197 23 456 A1 | 12/1998 |
| DE | 199 36 858 C1 | 5/2001 |
| DE | 100 16 476 A1 | 12/2001 |
| DE | 100 33 196 A1 | 1/2002 |
| EP | 0 358 972 A1 | 3/1990 |
| EP | 1 138 917 A1 | 10/2001 |
| EP | 1 139 442 A1 | 10/2001 |
| JP | 2002101673 A * | 4/2002 |

* cited by examiner

MONITORING METHOD FOR AN ACTUATOR AND CORRESPONDING DRIVER CIRCUIT

BACKGROUND OF THE INVENTION

Field of the Invention

The invention relates to a driver circuit for an actuator, especially for a piezoelectric actuator for an injection valve of an internal combustion engine, as well as to a monitoring method for such a driver circuit In modern injection systems for internal combustion engines piezoelectric actuators are used as controls for the injection valves, which allows a highly dynamic control of the injection process by comparison with conventional magnetic valves. The stroke of this type of piezoelectric actuator and thereby the valve setting of the associated injection valve depends on the charge state, so that the piezoelectric actuator must be charged and discharged in accordance with the desired stroke.

A driver circuit for electrical activation of such a piezoelectric actuator is known from EP 1 138 917 A1, which features a direct current converter as well as a charge switch and of a discharge switch arranged on the input side. The charge switch connects a diode connected in series with the actuator to a supply voltage to charge the actuator, while the discharge switch connects the actuator to earth via the diode to discharge the actuator. The desired stroke of the actuator can be achieved by a pulse-width-modulated control of the charge switch and of the discharge switch.

In the addition the known driver circuit also allows the detection of an earth short-circuit of the actuator. To this end, within the context of a conventional error current measurement the current flowing through the actuator as well as the current flowing at another point of the actuator circuit is measured.

For error-free operation the two measured currents must match whereas a short circuit in the actuator circuit leads to different measured values since the current flows out at least partly via the short circuit. The two measured values are thus compared with one another with a corresponding diagnostic signal being generated depending on the comparison.

The first disadvantage of this known driver circuit is the fact that with a short circuit there must be a disconnection within a very short period of around 10 µs in order to prevent damage to the driver circuit.

A further disadvantage of the known driver circuit lies in the fact that decoupling the error current measurement from the input-side direct current converter is a relatively complex matter in circuit design terms. Else the influence of the direct current converter on the error current measurement would falsify the measurement result.

Another disadvantage of the known driver circuit is the fact that no distinction can be made between a short circuit to earth and a short circuit to the supply voltage.

SUMMARY OF THE INVENTION

The underlying object of the invention is therefore to create an improved driver circuit or a corresponding monitoring method for a driver circuit whereby it is possible to detect a short circuit and to make a distinction between an earth short circuit and a battery short circuit.

The invention includes the general technical teaching of making a distinction between at least three different states depending on the comparison of the measured currents and accordingly generating a diagnostic signal with at least three possible states.

The term a diagnostic signal with a number of possible states is to be understood within the context of invention in general terms and includes not only a diagnostic signal in the more narrow sense which for example can take on three different signal levels. Instead it is also possible for the diagnostic signal to consist of three digital signals which indicate in each case error-free operation, an earth short circuit or a short circuit to the supply voltage.

Nor is the invention limited to the type of a driver circuit described at the start, but can also be implemented with another type of driver circuit. For example a driver circuit can feature a transformer, with the primary side of the transformer being connected via a charge switch to a supply voltage while the secondary side is connected via a discharge switch to the piezoelectric actuator. A suitable pulse-width-modulated control of the charge switch and of the discharge switch then allows the charge state of the piezoelectric actuator to be set in accordance with the desired stroke so that the injection valve either opens or closes at the predetermined times.

A preferred embodiment of the invention also enables not only a short circuit detection but also a detection of a line interruption. Thus an interruption of the actuator circuit leads as a rule to a disproportionate voltage increase in the actuator circuit. There is thus provision in this embodiment for the electrical voltage to be measured in the actuator circuit and for the diagnostic signal to be generated depending on the measured value, with the diagnostic signal being able to adopt at least four different states to distinguish between error-free operation, an earth short circuit, a battery short circuit and a line interruption.

There are a number of existing options for detecting a line interruption on the basis of the measured voltage which will be described in brief below.

One variant of the invention makes provision for the voltage increase to be evaluated by for example measuring the time which elapses until a predetermined voltage threshold is reached. This variant is based on the knowledge that the voltage in the actuator circuit rises particularly quickly during a charge process if the line to the actuator is interrupted.

In another variant of the invention the voltage which is set in the actuator circuit after a charge pulse of the driver circuit is measured. This measured value is then compared to the known Zener voltage of the protective diode in order to create the diagnostic signal depending on the comparison.

A further variant of the invention makes provision for detecting a line interruption by measuring the voltage above the normal working range during the charging while the charge current is limited or the primary side of the driver circuit is switched off.

The error current measurement in accordance with the invention in the actuator circuit can be undertaken in different ways, with a number of possibilities being briefly described below.

One variant of the invention makes provision for the current in the actuator circuit to be measured at both measuring points on the low side by measuring the voltage via a resistor connected to earth in each case. The advantage of this a low-side error current measurement at both measuring points is the relative lack of complexity of the circuit since the measured voltages are directly proportional to the relevant current.

In another variant of the invention the error current measurement is undertaken on the other hand at both measurement points in the actuator circuit on the voltage side using two shunts which are arranged on the voltage side in series in the actuator circuit. The voltage drop over these shunts then reflects the current in the actuator circuit.

In a further variant of the invention the error current is instead measured in the actuator circuit at a measuring point by an earth-side shunt and at the other measuring point by a shunt arranged on the voltage side.

The voltage-side error current measurement mentioned above can also be undertaken with coils instead of a measurement shunt, a method which is sufficiently well known per se.

In a preferred embodiment of the invention there is further provision for the measurement points for the error current measurement to be decoupled by the circuitry from the input of the driver circuit to avoid an input-side falsification of the error current measurement. This especially makes sense if the driver circuit features a direct current converter on the input side. The decoupling of the measurement points arranged in the actuator circuit from the input of the driver circuit for error current measurement can be undertaken for example by electrical isolation by arranging a transformer between the input of the driver circuit and the actuator circuit.

In addition the invention also includes a correspondingly designed driver circuit which allows detection and differentiation of a short circuit to earth and supply voltage.

BRIEF DESCRIPTION OF THE DRAWING

Other advantageous developments of the invention are contained in the subclaims or are explained below together with the description of the preferred exemplary embodiment of the invention with a reference to the drawings. The Figures show:

DESCRIPTION OF THE PREFERRED EMBODIMENT

Figure 1:
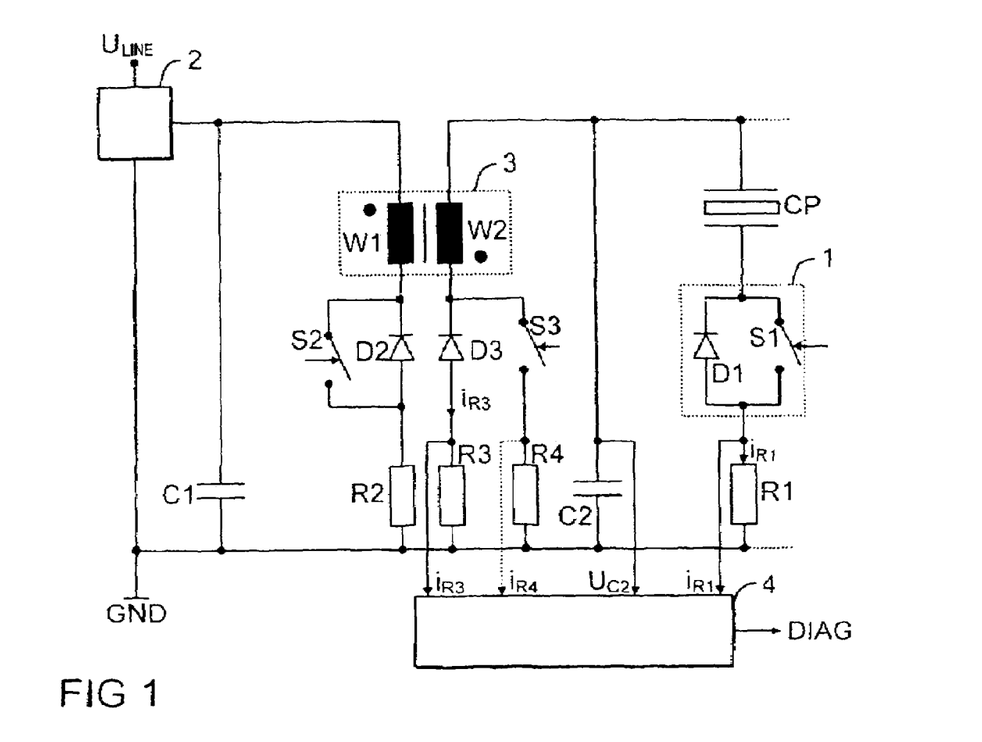
FIG. 1 a block diagram of a driver circuit in accordance with the invention.

The driver circuit shown in FIG. 1 is used for electrical control of piezoelectric actuators of injection valves of an internal combustion engine. For simplification only a single actuator CP is shown, although a number of actuators are present, corresponding to the number of combustion chambers. The actuators not shown are however identically constructed and connected in parallel to the actuator CP, as is shown by the dotted lines.

The actuator CP—like the further actuators not shown in the drawing for the other combustion chambers of the internal combustion engine—is connected in series with a selection switch 1 and a resistor R1, with the selection switch 1 consisting of a parallel circuit made up of a switching element S1 and a diode D1. The selection switch 1 makes it possible to select one of the actuators for a charge or discharge process in that the relevant switch S1 through connects while the corresponding switches for the other actuators disconnect.

The power is supplied for the driver circuit by a voltage converter 2 which on the output side is buffered by a capacitor C1 and when used in a motor vehicle is supplied by the vehicle's on-board network with a line voltage $U_{LINE}$=42V.

Between the actuator CP and the voltage converter 2 there is in this case a transformer 3 with a primary winding W1 and a secondary winding W2, with the primary winding W1 being connected to the voltage converter 2 while the secondary winding is connected to the actuator CP.

The primary winding W1 of the transformer 3 is connected in series with a resistor R2 and a parallel circuit comprising a diode D2 and a charge switch S2. To charge the control element the charge switch S2 is activated with a predetermined frequency and predetermined sampling rates in pulse mode with a predetermined number of pulse-width-modulated signals at the pre-determined charge voltage. During the conducting state of the charge switch S2 the current through the primary coil W1 increases and is interrupted at a predetermined point in time by opening the charge switch S2 (making it non-conducting). In this non-conducting phase of the primary side a pulse-form voltage flows over the secondary winding W2 for a current corresponding to the winding ratio W2/W1 which is smoothed by a capacitor C2, and charges the actuator CP with each current pulse until finally after the predetermined number of pulses a predetermined actuator voltage is approximately reached. The secondary circuit is closed via the selection switch 1 when the actuator CP is being charged.

The secondary winding W2 of the transformer 3 is connected in series with two parallel circuit branches, with one circuit branch consisting of a series circuit of a diode D3 and a resistor R3 which carries the current during the charge process while the other circuit branch is formed by a series circuit comprising a discharge switch S3 and a resistor R4 and carries the current during the discharging of the actuator CP.

The actuator CP is also discharged with pulse-width modulated signals by the discharge switch S3 being controlled by conducting and non-conducting pulses which reduces the actuator voltage. In this case the current flows from the actuator CP over the secondary winding W2, the discharge switch S3 and the selection switch 1 back to the actuator CP.

For each opening of the discharge switch S3 a part of the discharge energy is transmitted to the primary side of the transformer 3 and stored back into the charge capacitor C1. The primary circuit closes via the diode D2.

The selection switch 1, the charge switch S2 and the discharge switch S3 are activated in a conventional way by pulse-width-modulated control signals and this is thus not described in any greater detail.

In addition the driver circuit features a diagnostic unit 4 to detect a short circuit of the actuator CP or a line interruption as will be described later with reference to the flowchart shown in FIGS. 2a and 2b.

Various error cases of the driver circuit are first described below, these being shown in FIGS. 3a to 3h and being able to be detected by the diagnostic unit 4.

Figure 2A:
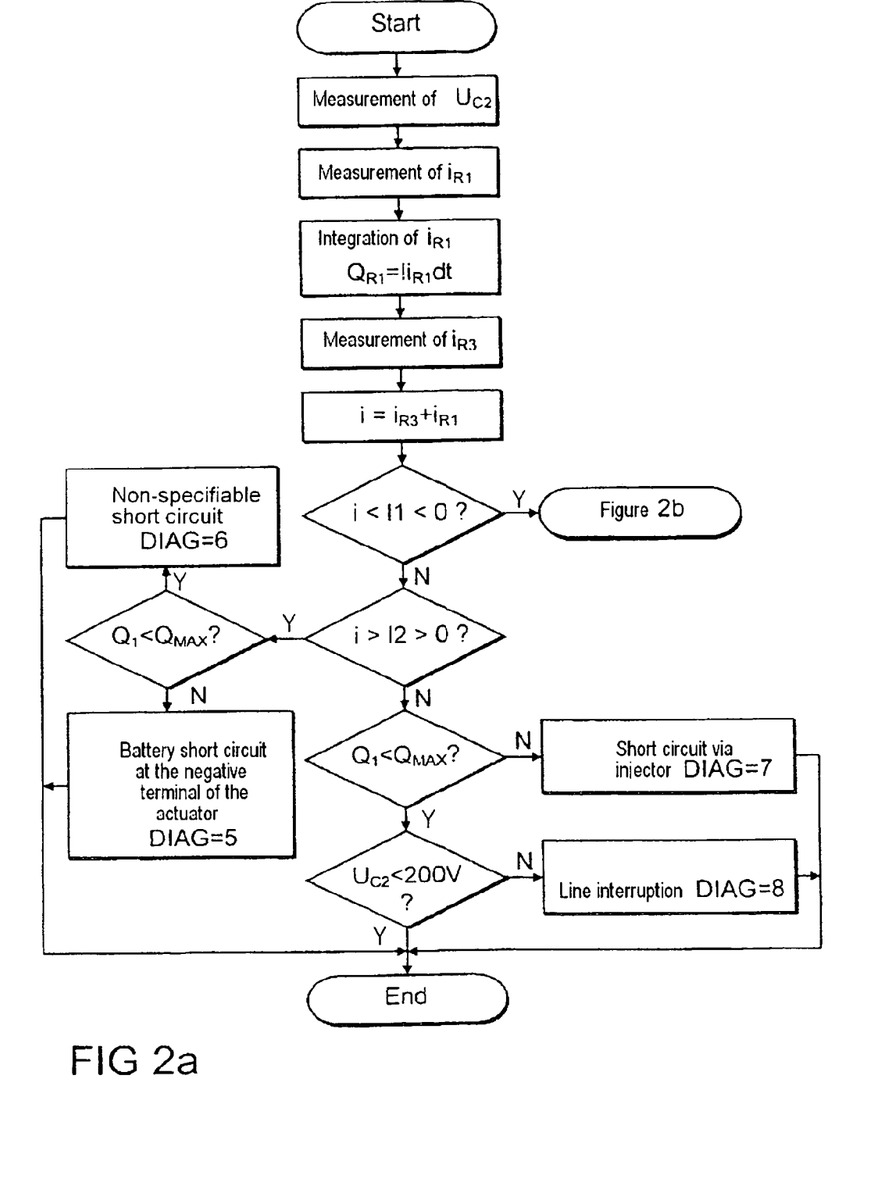
FIGS. 2a and 2b a flowchart of the monitoring method in accordance with the invention for the driver circuit in accordance with FIG. 1 and FIG. 3a to 3h different error cases of the driver circuit from FIG. 1.
Figure 2B:
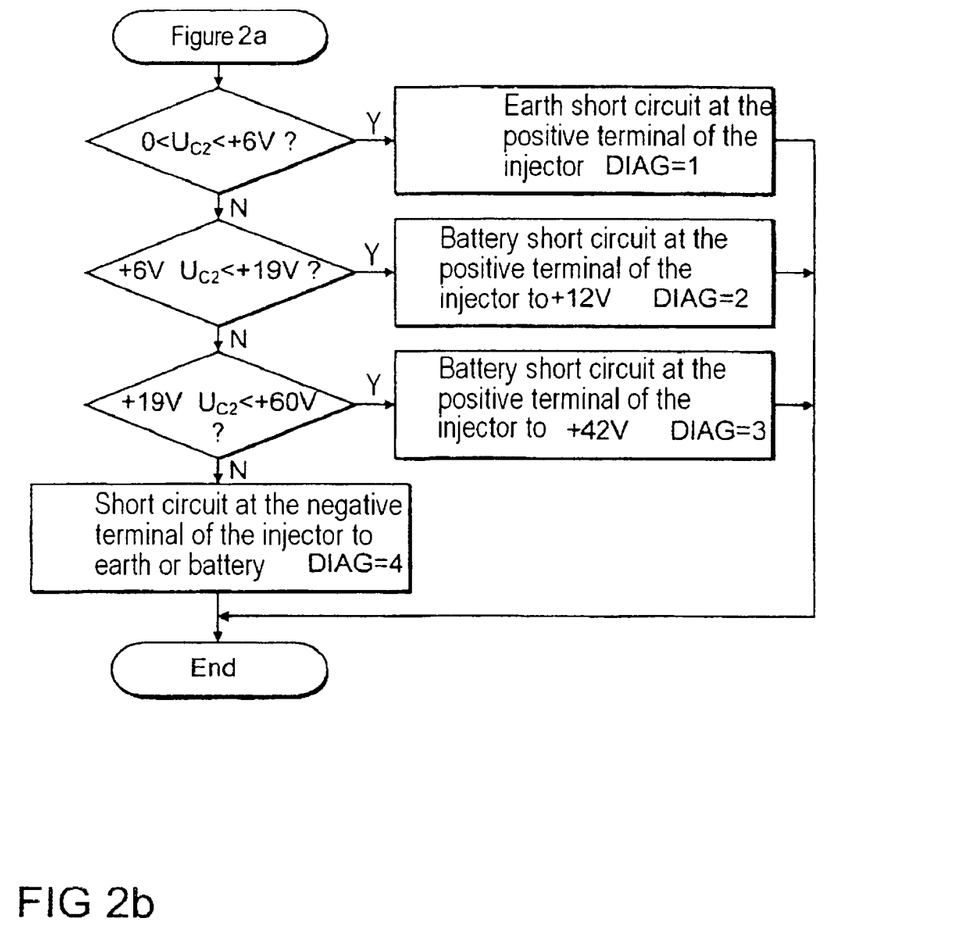
Figure 3A:
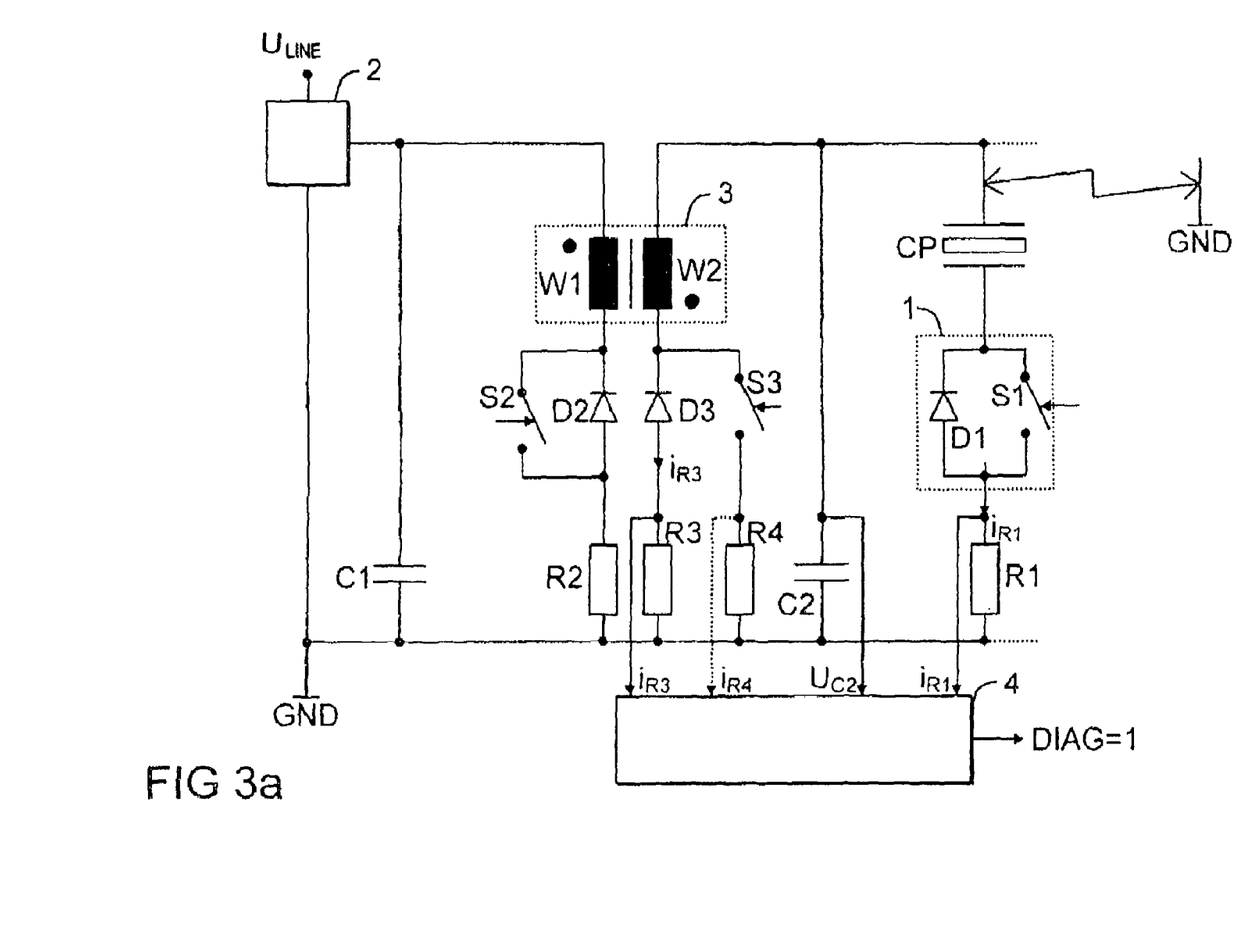

FIG. 3a shows an earth short circuit at the positive terminal of the actuator CP, so that the capacitor C2 is completely discharged via the earth short circuit. The result of this is that the voltage $U_{C2}$ measured by the diagnostic unit 4 falls to zero. On the other hand the currents $I_{R1}$ and $I_{R3}$ in the actuator circuit measured by the diagnostic unit 4 are no longer exactly the same for an earth short circuit at the positive terminal of actuator CP since the actuator circuit then features a number of meshes. The diagnostic unit 4 can also detect an earth short circuit at the positive terminal of the actuator CP on the basis of a measurement of the voltage $U_{C2}$ and the currents $I_{R1}$ and $I_{R3}$. The diagnostic signal DIAG generated by the diagnostic unit 4 assumes the value DIAG=1 in this error case, with the determination of the diagnostic signal DIAG being described in greater detail with reference to the flowchart shown in the FIGS. and 2a and 2b.

Figure 3B:
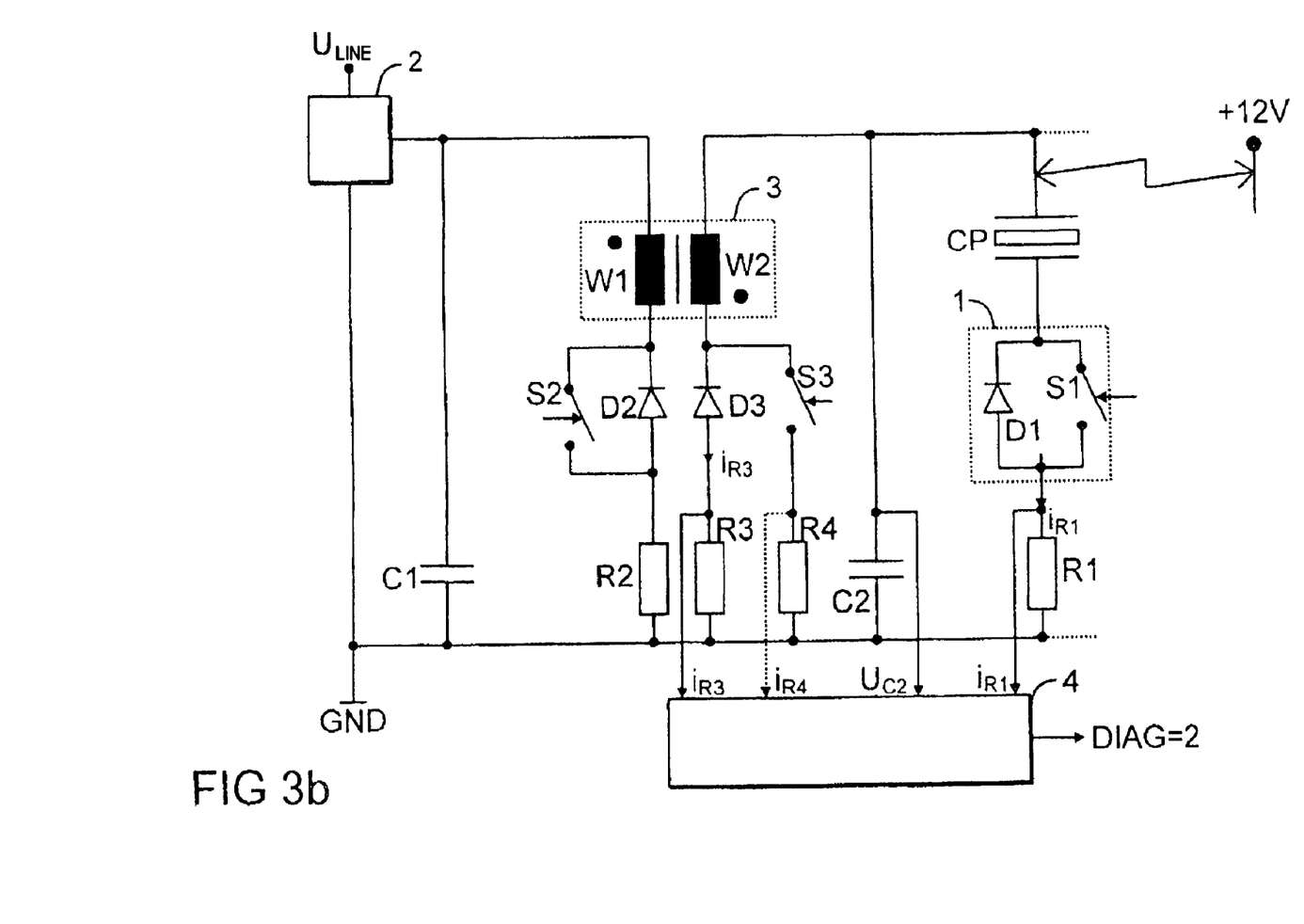

FIG. 3b by contrast shows a short circuit to a battery voltage of +12V at the positive terminal of the actuator CP. In this case too the two currents $I_{R1}$ and $I_{R3}$ do not match exactly since the actuator circuit features a number of meshes because of the short circuit. The voltage $U_{C2}$ measured by the diagnostic unit is however essentially the same as the battery voltage ($U_{C2} \approx +12V$), which allows it to be distinguished from the earth short circuit at the positive terminal of the actuator CP shown in FIG. 3a. The diagnostic signal DIAG generated by the diagnostic unit 4 assumes the value DIAG=2 in this error case, with the determination of the diagnostic signal DIAG being described in greater detail with reference to the flowchart shown in the FIGS. and 2a and 2b.

Figure 3C:
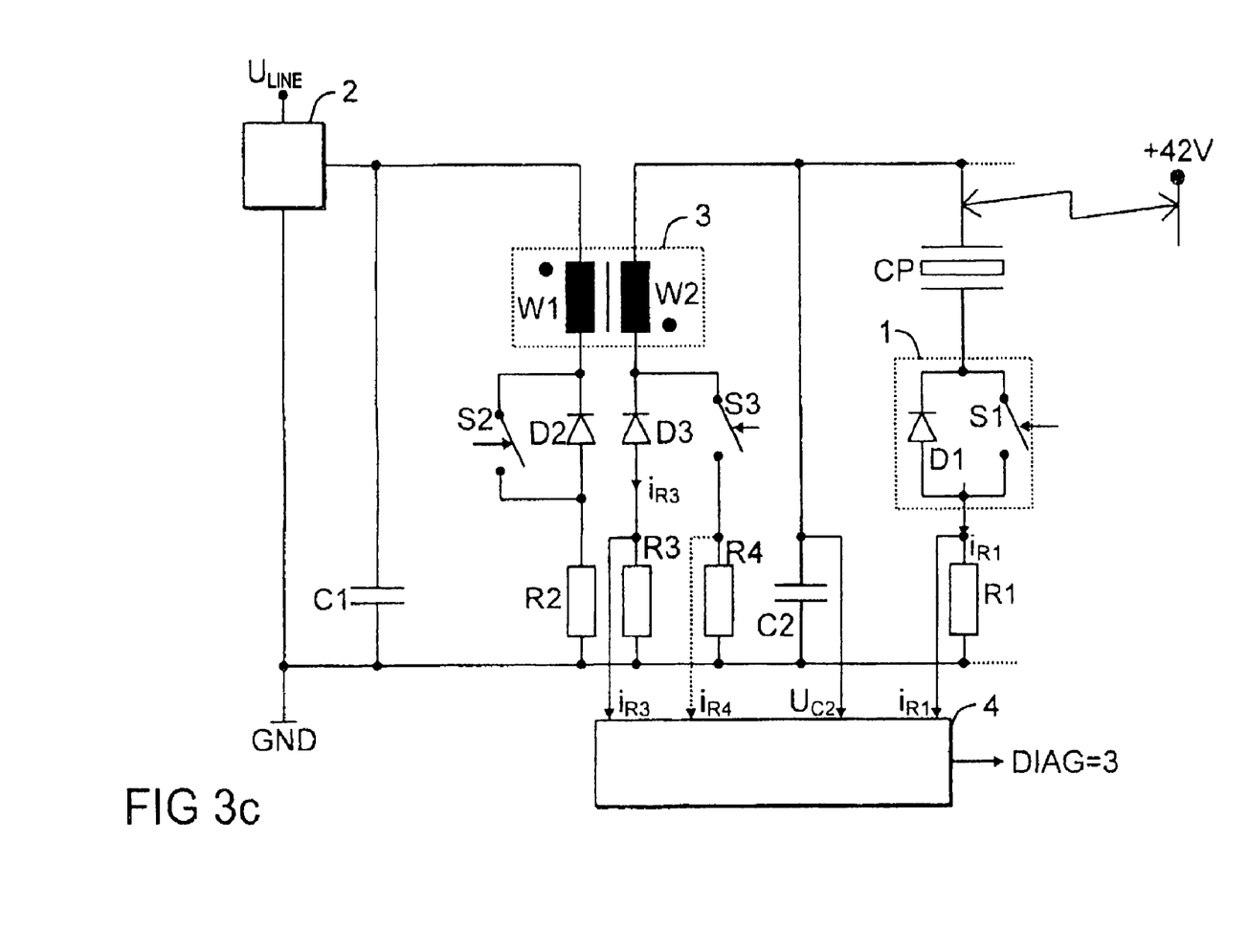

FIG. 3c further shows a short circuit to a battery voltage of +42V at the positive terminal of the actuator CP. In this error case the currents $I_{R1}$ and $I_{R3}$ also do not match since the actuator circuit becomes multi-meshed by the battery short circuit. The voltage $U_{C2}$ is however essentially the same here as the battery voltage, i.e. $U_{C2} \approx +42V$. The diagnostic signal DIAG generated by the diagnostic unit 4 assumes the value DIAG=3 in this error case, with the determination of the diagnostic signal DIAG being described in greater detail with reference to the flowchart shown in the FIGS. and 2a and 2b.

Figure 3D:
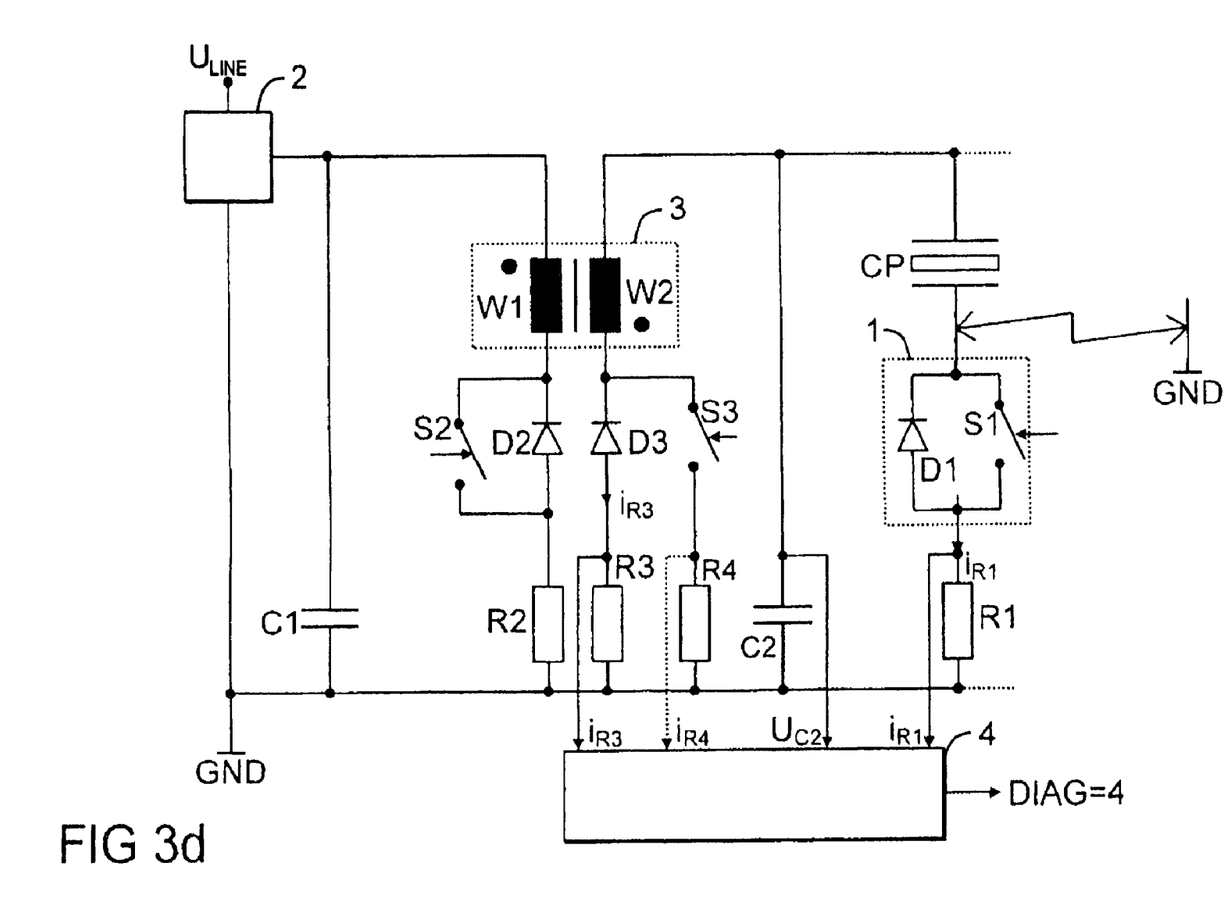

Further FIG. 3d shows an error case of the driver circuit, in which an earth short circuit occurs at the negative terminal of the actuator CP. This it in its turn results in the currents $I_{R1}$ and $I_{R3}$ assuming different values since the actuator circuit becomes multimeshed by the short circuit. The voltage $U_{C2}$ however depends here on the charge state of the actuator and can be far above the battery voltage of +42V which allows it to be distinguished from the error cases previously described in which the currents $I_{R1}$ and $I_{R3}$ are also different. The diagnostic signal DIAG generated by the diagnostic unit 4 assumes the value DIAG=4 in this error case, with the determination of the diagnostic signal DIAG being described in greater detail with reference to the flowchart shown in the FIGS. and 2a and 2b.

Figure 3E:
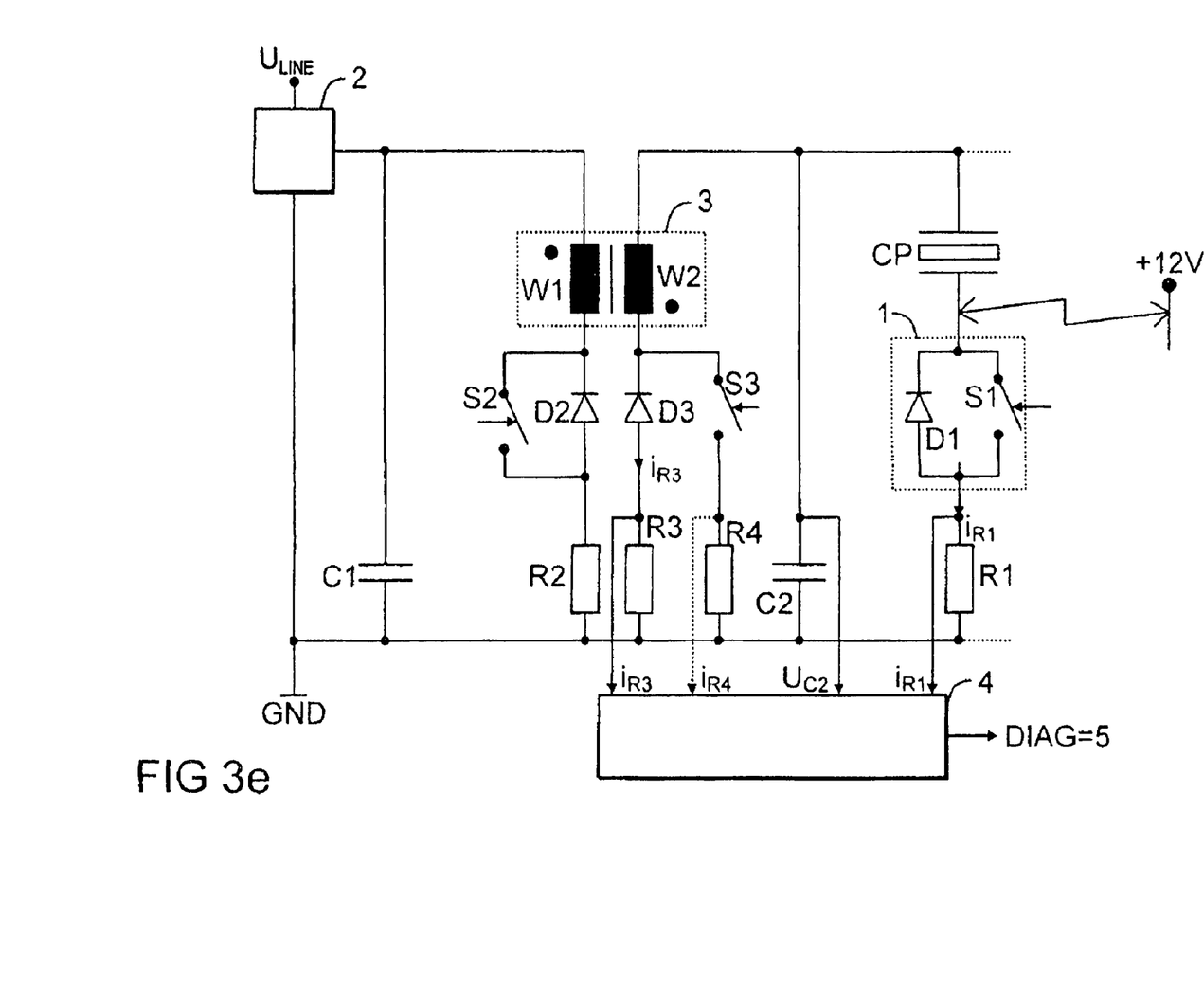

In addition FIG. 3e shows an error case of the driver circuit in which a short circuit to a battery voltage of +12 V occurs at a negative terminal of the actuator CP. This in its turn results in the currents $I_{R1}$ and $I_{R3}$ assuming different values since the actuator circuit becomes multimeshed by the short circuit. The voltage $U_{C2}$ also depends in this case on the charge state of the actuator and can be far above the battery voltage of +42V, which enables a distinction to be made from the short circuits at the positive terminal of the actuator CP shown in FIGS. 3a to 3c, in which the currents $I_{R1}$ and $I_{R3}$ are also different. The diagnostic signal DIAG generated by the diagnostic unit 4 assumes the value DIAG=5 in this error case, with the determination of the diagnostic signal DIAG being described in greater detail with reference to the flowchart shown in the FIGS. and 2a and 2b.

Figure 3F:
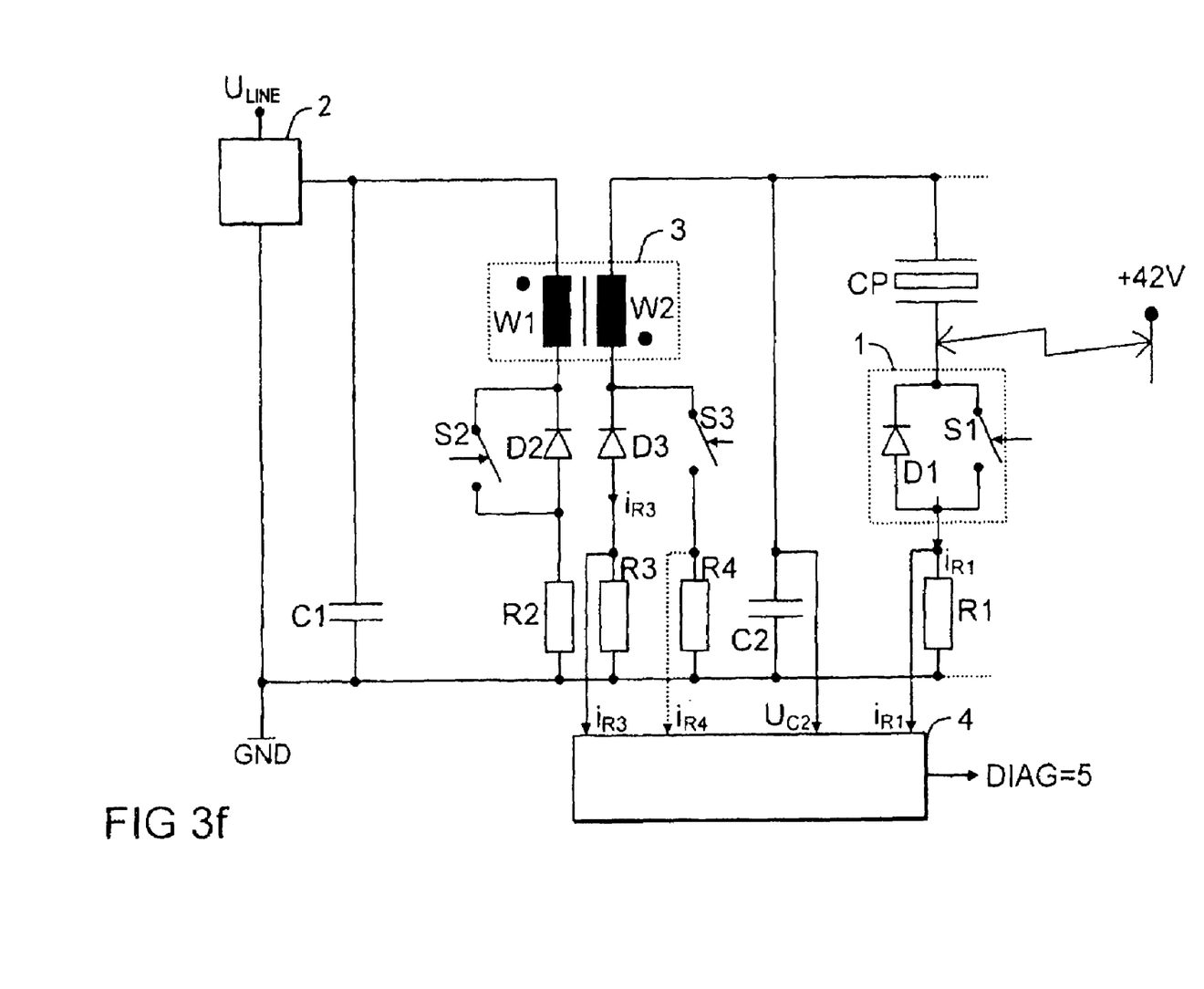

In addition FIG. 3f shows an error case of the driver circuit in which a short circuit to a battery voltage of +42 V occurs at a negative terminal of the actuator CP. In this case the currents $I_{R1}$ and $I_{R3}$ also assume different values since the actuator circuit becomes multimeshed by the short circuit. The voltage $U_{C2}$ again depends in this case on the charge state of the actuator and can be far above the battery voltage of +42V, which enables a distinction to be made from the short circuits at the positive terminal of the actuator CP shown in FIGS. 3a to 3c, in which the currents $I_{R1}$ and $I_{R3}$ are also different. The diagnostic signal DIAG generated by the diagnostic unit 4 assumes the value DIAG=5 in this error case, with the determination of the diagnostic signal DIAG being described in greater detail with reference to the flowchart shown in the FIGS. and 2a and 2b.

The error cases shown in the FIGS. 3d to 3f with a short circuit at the negative terminal of the actuator CP can be distinguished if for a short circuit the charge is observed which flows during a predetermined period of time over the resistor R1 to ground. This electrical charge is namely produced with an activated switch S1 solely from the short-circuit voltage 0V, +12V or +42V, the resistor R1 and the integration time. The possible distinction of the various short circuit cases at the negative terminal of the actuator CP will be described in detail later with reference to FIGS. 2a and 2b.

Figure 3G:
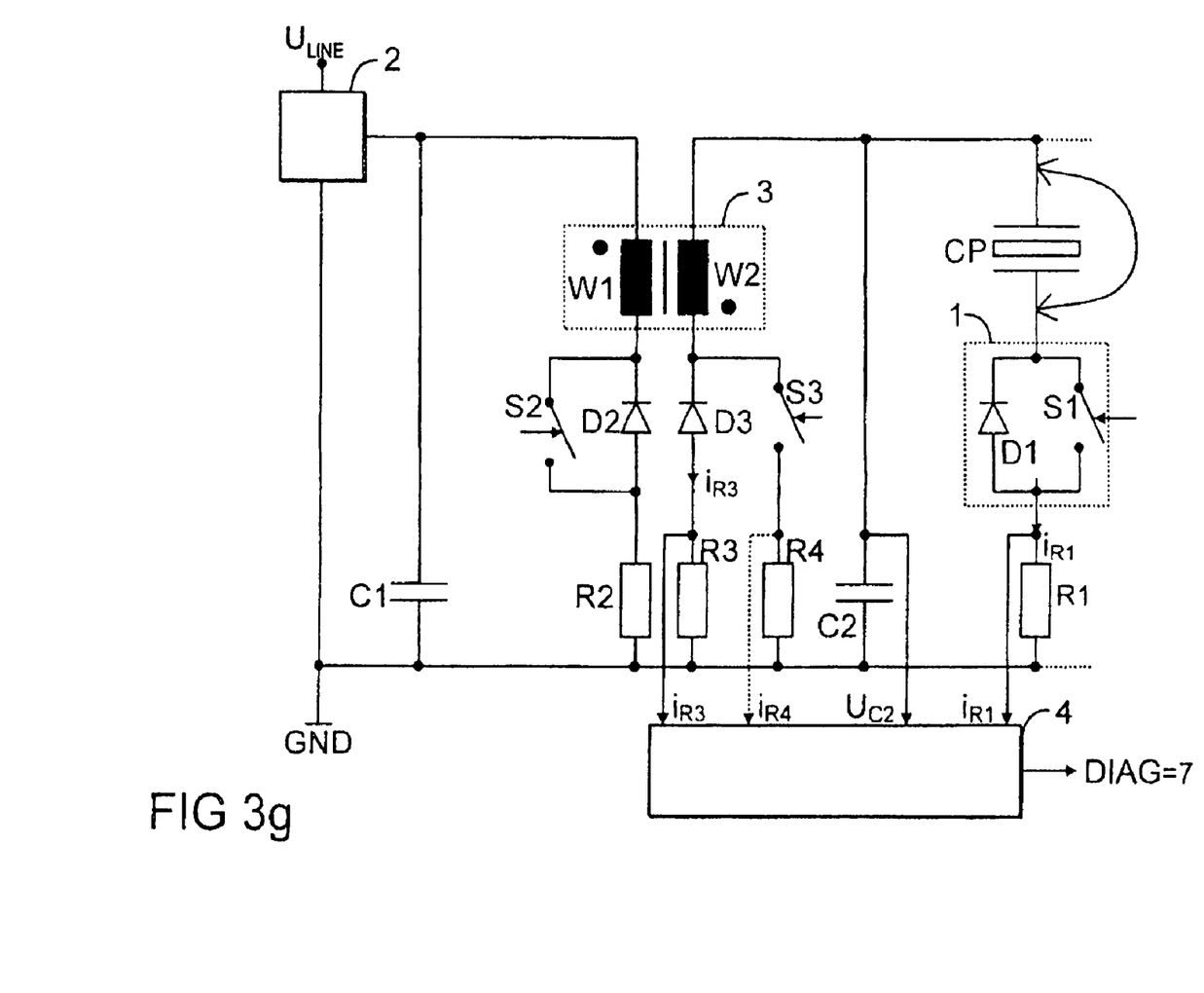

FIG. 3g shows an error of the driver circuit, in which a short circuit occurs via the actuator CP itself. In this case the actuator circuit remains single-meshed, so that the currents $I_{R1}$ and $I_{R3}$ measured by the diagnostic unit are essentially the same size. The current $I_{R1}$ flowing in the actuator circuit is however significantly larger in the case of this error. The diagnostic signal DIAG generated by the diagnostic unit 4 assumes the value DIAG=7 in this error case, with the determination of the diagnostic signal DIAG being described in greater detail with reference to the flowchart shown in the FIGS. and 2a and 2b.

Figure 3H:
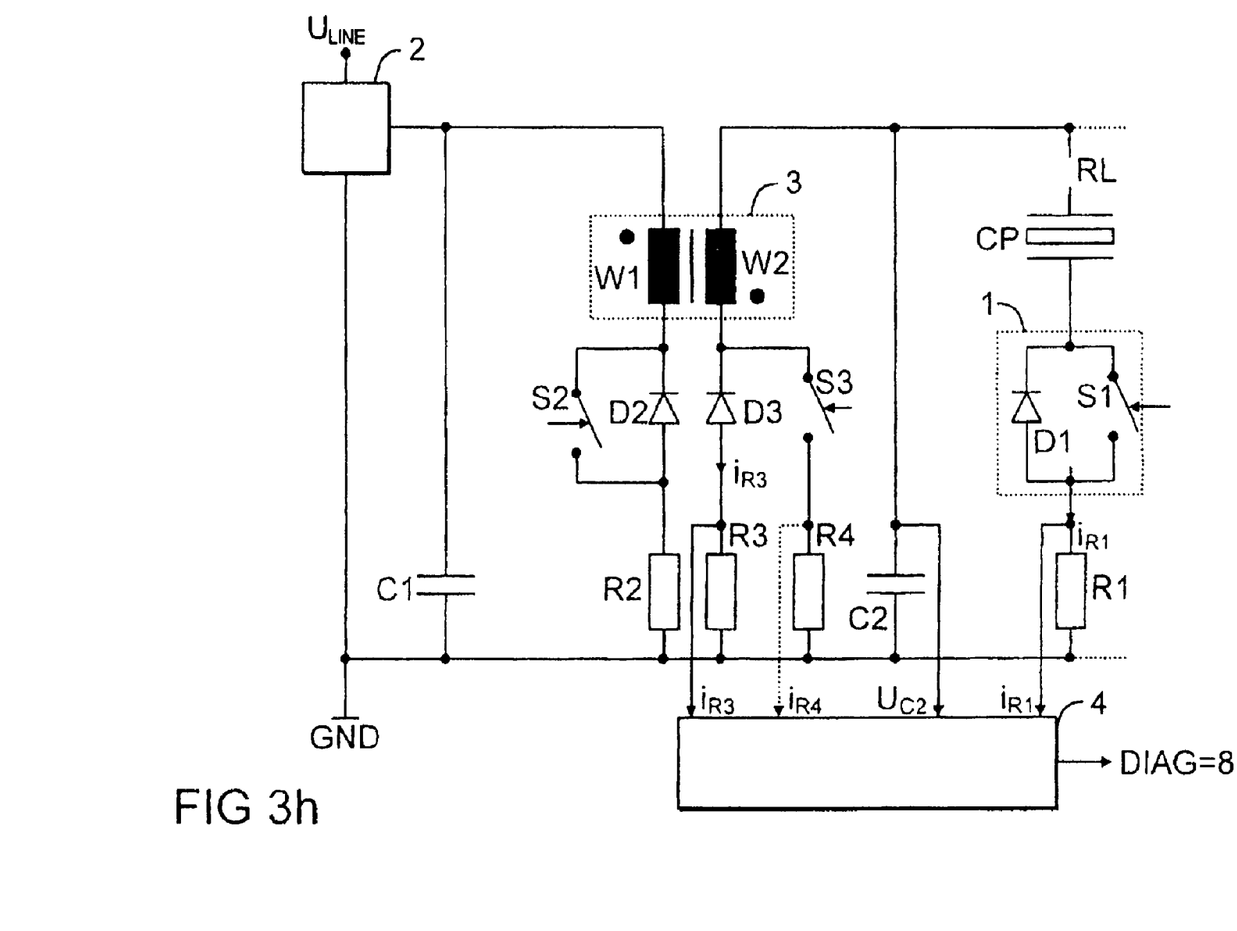

Finally FIG. 3h shows an error of the driver circuit in which a line interruption occurs in the actuator branch of the actuator circuit. The line interruption is shown here by an limitless line resistance $R_L$. The result of this is that the driver circuit charges the capacitor C2 instead of the actuator CP, so that the voltage $U_{C2}$ measured by the diagnostic unit 4 can rise to values of more than +200V. The diagnostic signal DIAG generated by the diagnostic unit 4 assumes the value DIAG=8 in this error case, with the determination of the diagnostic signal DIAG being described in greater detail with reference to the flowchart shown in the FIGS. and 2a and 2b.

The Table below shows the different error states and the resulting value of the diagnostic signal:

DIAG: Drawing: Error state:
0 FIG. 1 no error
1 FIG. 3a earth short circuit at the positive terminal of the actuator CP
2 FIG. 3b battery short circuit to +12V at the positive terminal of the actuator CP
3 FIG. 3c battery short circuit to +42V at the positive terminal of the actuator CP
4 FIG. 3d short circuit at the negative terminal of the actuator CP to earth or battery
5 FIG. 3e battery short circuit at the negative terminal of the actuator CP
6 - - - non-specifiable short circuit
7 FIG. 3g short circuit via the actuator CP
8 FIG. 3h line interruption The inventive monitoring method which is executed by the diagnostic unit 4 is now described below with reference to FIGS. 2a and 2b.

First the diagnostic unit 4 measures the electrical voltage $U_{C2}$ which falls via capacitor C2. The knowledge of this voltage for example allows the short circuits shown in FIGS. 3a to 3c at the positive terminal of the actuator to be distinguished.

In addition the diagnostic unit 4 uses a voltage tap to measure the voltage dropping via the resistor R1, with this voltage reflecting the current $i_{R1}$ which flows through the resistor R1 and the actuator CP during the charging process in the actuator circuit.

The current $I_{R1}$ is then integrated over a specified observation period in order to determine the charge $Q_1$ which flows out to earth during the observation period via the resistor R1. The knowledge of the charge Q1 enables a distinction to be made between the error case described in the FIGS. 3f-3h, as will be described in detail below.

Furthermore the diagnostic unit 4 uses a voltage tap to measure the voltage dropping via the resistor R3 which reproduces the current $i_{R3}$ flowing through the resistor R3 in the actuator circuit during the charging process.

In error-free operation without short circuit or line interruption the currents $I_{R3}$ and $I_{R1}$ must match without significant deviations. The diagnostic unit 4 therefore calculates the error current $\Delta i = i_{R3} + i_{R1}$ at the earth point and compares this deviation $\Delta i$ with a negative limit value I1<0A and a positive limit value I2>0A, in order to create the diagnostic signal DIAG as a function of the comparison.

Initially the error current $\Delta i$ is compared with the negative limit value I1 to check whether there is a short circuit at the positive terminal of the actuator CP. With a short circuit at the positive terminal of the actuator CP the current $i_{R3}$ is namely compartively significantly greater than the current $I_{R1}$, so that the error current $\Delta i$ falls below the negative limit value I1. In this case the diagnostic unit 4 continues the monitoring method in accordance with the invention with the steps shown in FIG. 2b, which are described below.

In FIG. 2b an initial check is made whether the short circuit at the positive terminal of the actuator CP is an earth short circuit. In this case the voltage $U_{C2}$ must namely approximately match the earth potential. The diagnostic unit 4 therefore compares the measured voltage $U_{C2}$ with earth potential 0V and with a positive limit value +6V, with an earth short circuit being assumed if the voltage $U_{C2}$ lies within this voltage range. The diagnostic unit 4 then sets the diagnostic signal DIAG to the value DIAG=1 in order to indicate an earth short circuit at the positive terminal of the actuator CP. Subsequently the diagnostic unit 4 then ends the monitoring method in accordance with the invention since the error has been detected and shown.

Else the diagnostic unit checks whether the short circuit at the positive terminal of the actuator CP is a short circuit against the battery voltage of +12V. If it is the voltage $U_{C2}$ measured by the diagnostic unit 4 must namely lie between +6V and +19V. The diagnostic unit 4 therefore compares the voltage $U_{C2}$ with these limit values and if necessary sets the diagnostic signal DIAG to a value DIAG=2 to indicate that the positive terminal of the actuator CP has a short circuit to the battery voltage of +12V. Subsequently the diagnostic unit 4 then ends the monitoring method in accordance with the invention since the error has been detected and shown.

If the check on the voltage $U_{C2}$ does not reveal either an earth short circuit or a battery short circuit to +12V at the positive terminal of the actuator CP, the diagnostic unit 4 checks in a next step whether the positive terminal of the actuator CP exhibits a short circuit to the battery voltage of +42V. In this case the voltage $U_{C2}$ measured by the diagnostic unit 4 must namely lie between +19V and +60V. The diagnostic unit 4 therefore compares the voltage $U_{C2}$ with these limit values and if necessary sets the diagnostic signal DIAG to a value DIAG=3 to indicate that the positive terminal of the actuator CP has a short circuit to the battery voltage of +42V. Subsequently the diagnostic unit 4 then ends the monitoring method in accordance with the invention since the error has been detected and shown.

If this check does not reveal a short circuit at the positive terminal of the actuator CP either, a short circuit at the negative terminal of the actuator CP is assumed in a next step. In this case however it is not possible to specify further whether the negative terminal of the actuator CP is exhibiting a short circuit to earth or to battery voltage. Thus one of the error cases depicted by FIGS. 3d to 3f can be present. Failing further information, the diagnostic unit 4 then sets the diagnostic signal DIAG to a value of DIAG=4 and subsequently ends the monitoring method.

The description of FIG. 2a is now continued below for the case in which the error current $\Delta i$ is positive or comparatively less than the limit value I1.

In this case a check is made in a next step as to whether the error current $\Delta i$ exceeds the positive limit value I2.

If it does not, both currents $i_{R1}$ and $i_{R3}$ are essentially the same size. This prompts the conclusion that neither a battery short circuit nor an earth short circuit is present.

In a further step a check is then made as to whether a short circuit via the actuator CP is present, which is shown as an error in FIG. 3g. To this end the diagnostic unit 4 compares the charge $Q_1$ flowing out via the resistor R1 to earth with a predetermined limit value $Q_{MAX}$. If the charge Q1 exceeds the limit value $Q_{MAX}$, there is a short circuit via the actuator CP and the diagnostic unit 4 sets the diagnostic signal DIAG to the value DIAG=7. Subsequently the diagnostic unit 4 then ends the monitoring method in accordance with the invention since the error has been detected and shown.

Else the diagnostic unit 4 checks in a further step whether the line interruption error shown in FIG. 3h is present. To this end the diagnostic unit 4 compares the measured voltage $U_{C2}$ with a predetermined limit value of +200V. If the voltage $U_{C2}$ exceeds the limit value there is a line interruption and the diagnostic unit 4 sets the diagnostic signal DIAG to the value DIAG=8. Subsequently the diagnostic unit 4 then ends the monitoring method in accordance with the invention since the error has been detected and shown.

If the check on the error current $\Delta i$ reveals however that the positive limit value 12 is exceeded, there must be a short circuit in the actuator circuit.

In a next step a check is then made as to whether the charge which has flowed out via the resistor R1 to earth exceeds the predetermined limit value $Q_{MAX}$.

If it does, there is a battery short circuit at the negative terminal of the actuator CP and the diagnostic unit sets the diagnostic signal DIAG to the value DIAG=5. Subsequently the diagnostic unit 4 then ends the monitoring method in accordance with the invention since the error has been detected and shown.

Else there is a short circuit present which cannot be specified in any greater detail, so that the diagnostic unit sets the diagnostic signal DIAG to the value DIAG=6 and subsequently ends the monitoring method since the error was detected and shown.

In the exemplary embodiment of the invention described here the error can only be detected during a charging process, since only then does the current in the actuator circuit flow through the resistor R3, enabling it to be measured During a discharging process on the other hand the discharge switch S3 is closed so that the current in the actuator circuit flows through the resistor R4.

In a variant of the invention therefore the current $I_{R4}$ through the resistor R4 is additionally measured to also allow error detection during a discharging process. The additional voltage tap shown by the dotted lines is provided for this purpose, via which the diagnostic unit 4 measures the current $i_{R4}$ through the resistor R4.

The invention is not limited to the preferred exemplary embodiments described in this document. Instead a plurality of variants and derivatives are possible which also make use of the inventive idea and therefore fall into the protected area.

We claim:

1. A driver circuit for an actuator, comprising:
   an actuator circuit for charging and discharging the actuator, wherein the actuator is connected in said actuator circuit;
   a transformer having a primary winding and a secondary winding, said secondary winding connected in said actuator circuit;
   a first measuring device for measuring a first electrical current flowing through the actuator, said first measuring device having a first measurement resistor connected in series with the actuator;
   a second measuring device for measuring a second electrical current flowing in said actuator circuit before or after the actuator, said second measuring device having a second measurement resistor connected in series with said secondary winding of said transformer;
   a third measuring device for measuring an electrical voltage in said actuator circuit during a charging process;
   a comparator unit connected to said first, second, and third measuring devices, said comparator unit being configured to effect a comparison between the first and second electrical currents, and to generate a diagnostic signal in dependence on the comparison and in dependence on the electrical voltage measured by said third measuring device, the diagnostic signal taking on one of at least three different values depending on the comparison between the measured currents, in order to distinguish between a ground short circuit, a short circuit to a supply voltage, and an error-free state, respectively.

2. The driver circuit according to claim 1, wherein said actuator circuit has a first circuit branch and a parallel second circuit branch, said first circuit branch containing a discharge switch and carrying the electrical current during a discharging process, and said second circuit branch containing a diode and carrying the electrical current during a charging process.

3. The driver circuit according to claim 2, wherein said second measurement resistor is connected in the second circuit branch.

4. The driver circuit according to claim 1, wherein said first measuring device and said second measuring device are connected on a ground side of said actuator circuit.

5. The driver circuit according to claim 1, wherein said first measuring device and said second measuring device are connected on a voltage side of said actuator circuit.

6. The driver circuit according to claim 1, wherein one of said first and second measuring devices is connected on a ground side of said actuator circuit and one of said first and second measuring devices is connected on a voltage side thereof.

7. The driver circuit according to claim 1, wherein at least one of said first measuring device and said second measuring device is decoupled from a circuit input.

* * * * *